United States Patent
Wang et al.

(10) Patent No.: US 8,895,866 B2
(45) Date of Patent: Nov. 25, 2014

(54) PRINTED CIRCUIT BOARD STRUCTURE

(71) Applicants: Quanta Computer Inc., Taoyuan Shien (TW); Tech-Front (Shanghai) Computer Co., Ltd., Songjiang EPZ Shanghai (CN)

(72) Inventors: Steven Wang, Songjiang EPZ Shanghai (CN); Jin-Chang Wu, New Taipei (TW); Mide Yang, Songjiang EPZ Shanghai (CN)

(73) Assignees: Quanta Computer Inc., Taoyuan Shien (TW); Tech-Front (Shanghai) Computer Co., Ltd., Shanghai (CN)

( * ) Notice: Subject to any disclaimer, the term of this patent is extended or adjusted under 35 U.S.C. 154(b) by 206 days.

(21) Appl. No.: 13/741,913

(22) Filed: Jan. 15, 2013

(65) Prior Publication Data

US 2014/0041903 A1 Feb. 13, 2014

(30) Foreign Application Priority Data

Aug. 13, 2012 (CN) .......................... 2012 1 0286911

(51) Int. Cl.
*H05K 1/03* (2006.01)
*H05K 1/02* (2006.01)
*H05K 3/46* (2006.01)

(52) U.S. Cl.
CPC ............ *H05K 1/0298* (2013.01); *H05K 3/4688* (2013.01); *H05K 2201/0209* (2013.01); *H05K 2201/029* (2013.01); *H05K 2201/068* (2013.01); *H05K 2201/0269* (2013.01)
USPC .......................................... 174/255; 174/259

(58) Field of Classification Search
USPC ................................................ 174/255–259
See application file for complete search history.

(56) References Cited

U.S. PATENT DOCUMENTS

2010/0263919 A1* 10/2010 Lee et al. ....................... 174/257
2010/0264552 A1* 10/2010 Nakasato et al. ............. 257/778

* cited by examiner

*Primary Examiner* — Jeremy C Norris
(74) *Attorney, Agent, or Firm* — Rabin & Berdo, P.C.

(57) ABSTRACT

A printed circuit board structure includes a plurality of circuit layer plates stacked together in which each of the stacked circuit layer plates includes an epoxy resin plate body and a fabric structure completely encapsulated in the epoxy resin plate body, and each circuit layer plate stacked between two circuit layer plates is further provided with filler particles distributed in its epoxy resin plate body, and the two opposite and outermost circuit layer plates thereof have metal soldering pads on the outer surfaces of the epoxy resin plate body thereof, and the two opposite and outermost circuit layer plates do not have the filler particles in its epoxy resin plate body thereof.

10 Claims, 2 Drawing Sheets

G: minimum distance from the outer surface of the second fabric in the second epoxy resin plate body to the outer surface of the second epoxy resin plate body P: weight percentage of the filler particles added in the second epoxy resin plate body

PRINTED CIRCUIT BOARD STRUCTURE

RELATED APPLICATIONS

This application claims priority to Chinese Application Serial Number 201210286911.6, filed Aug. 13, 2012, which is herein incorporated by reference.

BACKGROUND

1. Technical Field

The present disclosure relates to a printed circuit board.

2. Description of Related Art

A printed circuit board is normally made of epoxy resin with strengthened glass fibers embedded therein. However, with the miniaturization of the integrated circuit in electric industries, the epoxy resin of the printed circuit board is becoming deficient to provide expected performance in electricity conduction when high-speed elements thereon operate in high temperature. Thus, for the epoxy resin of the printed circuit board, more attentions have to be paid to its thermal expansion coefficient and heat resistance, and to bonding of the soldering pad of the printed circuit board to the epoxy resin. For instance, if the bonding strength between the epoxy resin and the soldering pad of the printed circuit board is not enough, cracks may occur on the printed circuit board to separate the soldering pad from the printed circuit board.

Given the above, the conventional printed circuit board still has the inconvenience and shortages and requires improvements. As such, there are still needs to effectively solve the inconvenience and shortages.

SUMMARY

One aspect of the present disclosure provides a printed circuit board structure with appropriate thermal expansion coefficient and the heat resistance, for increasing the bonding strength of the epoxy resin and the soldering pad of the printed circuit board.

A printed circuit board structure provided according to one embodiment of the disclosure comprises a plurality of circuit layer plates stacked together. Each of the circuit layer plates comprises an epoxy resin plate body and a fiber fabric completely encapsulated inside the epoxy resin plate body. Each of the circuit layer plates which is stacked between two of the circuit layer plates is further provided with filler particles distributed in the epoxy resin plate body of the circuit layer plate. Also, In all of the circuit layer plates, the two opposite and outermost circuit layer plates thereof are provided with metal soldering pads on outer surfaces of the epoxy resin plate bodies of the two opposite and outermost circuit layer plates, respectively, and both the two opposite and outermost circuit layer plates thereof have no filler particle in the epoxy resin plate body thereof.

A printed circuit board structure provided according to another embodiment of the disclosure comprises two opposite and outermost circuit layer plates and a middle layer. Each of the two opposite and outermost circuit layer plates comprises a first epoxy resin plate body, a metal soldering pad bonded on an outer surface of the first epoxy resin plate body, and a first fiber fabric completely encapsulated inside the first epoxy resin plate body. The middle layer comprises at least one circuit layer plate stacked between the two opposite and outermost circuit layer plates, and the circuit layer plate comprises a second epoxy resin plate body, a second fiber fabric completely encapsulated inside the second epoxy resin plate body, and filler particles distributed in the second epoxy resin plate body. Among the two opposite and outermost circuit layer plates and the at least one circuit layer plate of the middle layer, only the second epoxy resin plate body of the at least one circuit layer plate of the middle layer has the filler particles therein.

A printed circuit board structure provided according to the other embodiment of the disclosure comprises two opposite and outermost circuit layer plates, and at least one middle circuit layer plate stacked between the two opposite and outermost circuit layer plates. Each of the two opposite and outermost circuit layer plates comprising a first epoxy resin plate body, a metal soldering pad bonded on an outer surface of the first epoxy resin plate body, a first fiber fabric completely encapsulated inside the first epoxy resin plate body, and a plurality of first filler particles distributed in the first epoxy resin plate body with a first weight percentage being greater than zero. The middle circuit layer plate comprises a second epoxy resin plate body, a second fiber fabric completely encapsulated inside the second epoxy resin plate body, and a plurality of second filler particles distributed in the second epoxy resin plate body with a second weight percentage greater than the first weight percentage.

To sum, by organizing the quantity of the filler particles in the epoxy resin plate bodies of both the middle circuit layer plate and the two opposite and outermost circuit layer plates, the printed circuit board structure of the disclosure not only provides appropriate thermal expansion coefficient and the heat resistance thereof, but also enhances the bonding strength of the epoxy resin and the soldering pad of the printed circuit board, so as to increase product life and operation performance of the printed circuit board structure.

BRIEF DESCRIPTION OF THE DRAWINGS

The present disclosure will be apparent to those skilled in the art by reading the following detailed description of a preferred embodiment thereof, with reference to the attached drawings, in which.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Since the inventors of the present disclosure found that, after filler particles are added into the epoxy resin of the printed circuit board with proper proportion, the thermal expansion coefficient of the epoxy resin of the printed circuit board can be reduced, the heat resistance of the epoxy resin of the printed circuit board can be increased, and the toughness of the epoxy resin of the printed circuit board can be improved.

However, the inventor of the printed circuit board structure also found that the added filler particles in the epoxy resin of the printed circuit board also cause to decrease the bonding strength of the epoxy resin and the soldering pad arranged on an outer surface of the epoxy resin.

Therefore, by organizing the quantity of the filler particles in the epoxy resin plate bodies of the two opposite and outermost circuit layer plates and retaining the quantity of the filler particles in the epoxy resin plate body of the middle circuit layer plate, the printed circuit board structure of the disclosure not only provides appropriate thermal expansion coefficient and the heat resistance thereof, but also enhances the bonding strength of the epoxy resin and the soldering pad of the printed circuit board, so as to increase product life and operation performance of the printed circuit board structure.

Figure 1:
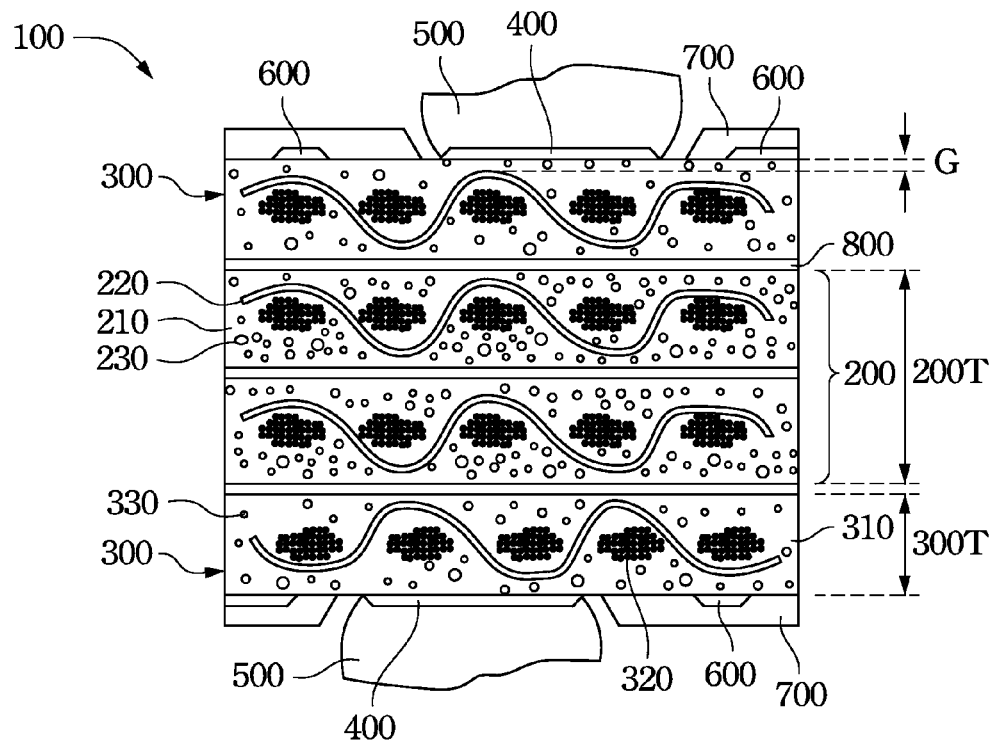
FIG. 1 is a part sectional view illustrating a printed circuit board structure according to a first embodiment of the present disclosure.

Reference is now made to FIG. 1. FIG. 1 is a part sectional view illustrating a printed circuit board structure 100 according to a first embodiment of the present disclosure.

The printed circuit board structure 100 provided in the present disclosure includes a plurality of stacked circuit layer plates, e.g. at least one first circuit layer plate 200 and two second circuit layer plates 300. The second circuit layer plates 300 are disposed to be the opposite and outermost layers of the stacked circuit layer plates of the printed circuit board structure 100. Thus, the second circuit layer plates 300 are called "the outermost circuit layer plate", respectively. The first circuit layer plate 200 is sandwiched between the second circuit layer plates 300. Thus, the first circuit layer plate 200 is called "the middle circuit layer plate" or "middle layer".

Each first circuit layer plate 200 sandwiched between the second circuit layer plates 300 can be considered as a circuit layer plate sandwiched between two circuit layer plates. Furthermore, the total thickness of the first circuit layer plate 200, e.g., first thickness 200T, is not smaller than the total thickness of each of the second circuit layer plates 300, e.g., second thickness 300T, however, the scope of the present disclosure is not limited by the mentioned rule which only serve for illustration.

Specifically, each first circuit layer plate 200 comprises a first epoxy resin plate body 210, a first fiber fabric 220 and a plurality of first filler particles 230. The first epoxy resin plate body 210 is a solid plate body formed by epoxy resin material. The first fiber fabric 220 is interwoven by a plurality of fiber bundles from Latitude and Longitude directions with each other, and the first fiber fabric 220 is completely encapsulated (buried) inside the first epoxy resin plate body 210 so as to increase the structural intense of the first circuit layer plate 200.

In the embodiment, the first fiber fabric 220 can be, for example, glass fiber, carbon fiber, Kevlar fiber and other fiber materials for making a printed circuit board, however, the scope of the present disclosure is not limited by the types of the fibers which only serve for illustration.

The first filler particles 230 are distributed in the first epoxy resin plate body 210 and surrounding the first fiber fabric 220 so as to reduce the thermal expansion coefficient of the first circuit layer plate 200, increase the heat resistance of the first circuit layer plate 200 and improve the toughness of the first epoxy resin plate body 210. Also, the first filler particles 230 are properly distributed in the first epoxy resin plate body 210 with a first weight percentage. The sizes, volumes, calibers and distribution densities of the first filler particles 230 are not all the same, however, the scope of the present disclosure is not limited by the parameters of the first filler particles 230 which only serve for illustration.

The aforementioned first weight percentage (X %) of the first filler particles 230 is defined as X units of weight of the first filler particles 230 in every 100 units of weight of first epoxy resin plate body 210. The first filler particles 230 can be organic filler particles or inorganic filler particles. The materials of the inorganic filler particles, for example, can be SiO2 (e.g., ball type silicon powder) or Al(OH)3 etc., however, the scope of the present disclosure is not limited by the types of the inorganic filler particles which only serve for illustration. The materials of the organic filler particles, for example, can be rubber (rubber powder) etc., however, the scope of the present disclosure is not limited by the types of the organic filler particles which only serve for illustration.

Each of the second circuit layer plates 300 comprises a second epoxy resin plate body 310, one or more metal soldering pads 400 (e.g. ball grid array, BGA), one or more metal printed lines 600, a second fiber fabric 320 and a plurality of second filler particles 330.

The second epoxy resin plate body 310 is a solid plate body formed by epoxy resin material. The metal soldering pads 400 are bonded on the outer surfaces of the second epoxy resin plate bodies 310 of the second circuit layer plates 300 relative to the first circuit layer plate 200 so as for soldering solder balls 500 on the metal soldering pads 400. The metal printed lines 600 are printed on the outer surfaces of the second epoxy resin plate bodies 310 of the second circuit layer plates 300 relative to the first circuit layer plate 200, and can be covered by the outer painted layer 700 (e.g., green paint).

Each of the second fiber fabrics 320 is interwoven by a plurality of fiber bundles from Latitude and Longitude directions with each other, and each of the second fiber fabric 320 is completely encapsulated (buried) inside the second epoxy resin plate body 310 so as to increase the structural intense of the second circuit layer plate 300. Thus, a minimum distance G is existed between the surface of the second fiber fabric 320 (e.g., the outermost fiber bundle) and the outer surface of the second epoxy resin plate body 310.

In the embodiment, the second fiber fabric 320 can be, for example, glass fiber, carbon fiber, Kevlar fiber and other fiber materials for making a printed circuit board, however, the scope of the present disclosure is not limited by the types of the fibers which only serve for illustration.

The second filler particles 330 are distributed in the second epoxy resin plate body 310 and surrounding the second fiber fabric 320 so as to reduce the thermal expansion coefficient of the second circuit layer plate 300, increase the heat resistance of the second circuit layer plate 300 and improve the toughness of the second epoxy resin plate body 310. Comparing to the aforementioned first weight percentage of the first filler particles 230, the second filler particles 330 are less distributed in the second epoxy resin plate body 310 with a second weight percentage, that is, the second weight percentage is less than the first weight percentage. The aforementioned second weight percentage (Y %) of the second filler particles 330 is defined as Y units of weight of the second filler particles 330 in every 100 units of weight of the second epoxy resin plate body 310.

The second filler particles 330 can be organic filler particles or inorganic filler particles. The materials of the inorganic filler particles, for example, can be SiO2 (e.g., ball type silicon powder) or Al(OH)3 etc., however, the scope of the present disclosure is not limited by the types of the inorganic filler particles which only serve for illustration. The materials of the organic filler particles, for example, can be rubber (rubber powder) etc., however, the scope of the present disclosure is not limited by the types of the organic filler particles which only serve for illustration.

The sizes, volumes, calibers and distribution densities of the second filler particles 330 are not all the same, however, the scope of the present disclosure is not limited by the parameters of the second filler particles 330 which only serve for illustration.

It is noted that the first circuit layer plate 200 and the second circuit layer plates 300 of the embodiment both have filler particles 230, 330, however, the total quantity, the total volume or the total contribution density of the second filler particles 330 of the second epoxy resin plate body 310 in one of the second circuit layer plates 300 is less than the total quantity, the total volume or the total contribution density of the first filler particles 230 of the first epoxy resin plate body 210 in the first circuit layer plates 200. So when each of the metal soldering pads 400 is bonded on the outer surface of the second epoxy resin plate body 310 of the second circuit layer plate 300, an enhanced bonding intense for bonding the metal soldering pad 400 and the second epoxy resin plate body 310 together can be provided so as to increase product life and operation performance of the printed circuit board structure 100.

Furthermore, in all of the stacked circuit layer plates, conductive patterns 800 can be respectively sandwiched between the first circuit layer plate 200 and anyone of the second circuit layer plates 300, and/or between any two neighboring circuit layer plates of the middle circuit layer plate 200. The conductive patterns 800 are electrically connected with each other, and are electrically connected with the opposite metal soldering pads 400 or/and the metal printed lines 600.

Figure 2:
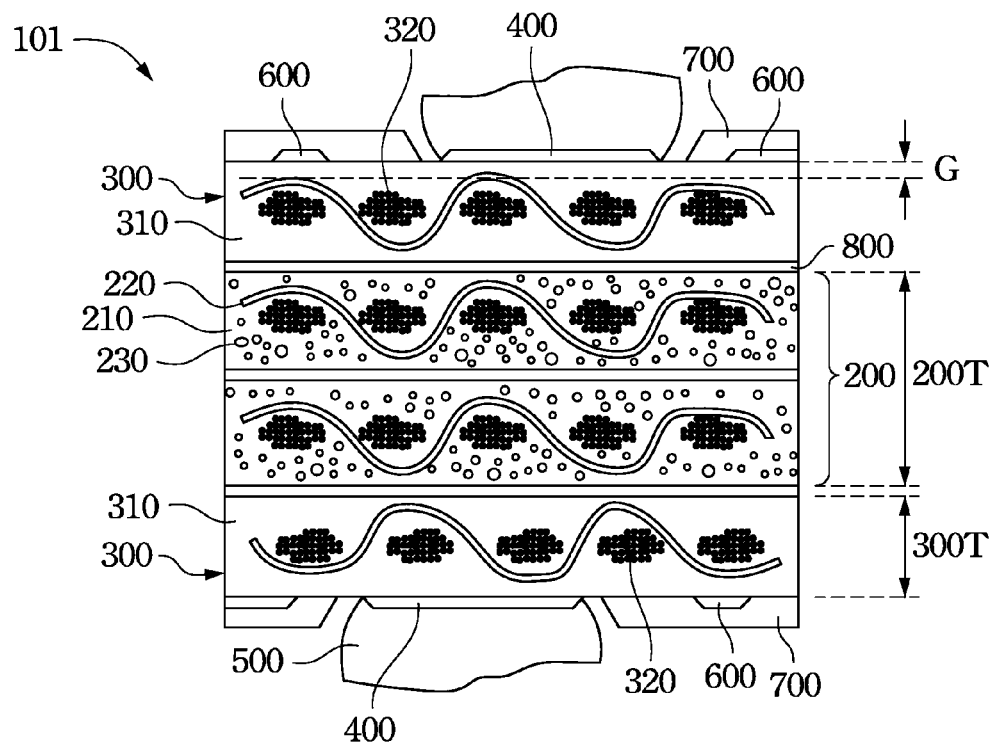
FIG. 2 is a part sectional view illustrating a printed circuit board structure according to a second embodiment of the present disclosure.

Reference is now made to FIG. 2. FIG. 2 is a part sectional view illustrating a printed circuit board structure 101 according to a second embodiment of the present disclosure.

The second embodiment provides a printed circuit board structure 101 which is similar to the printed circuit board structure 100 in structure, however, comparing to the printed circuit board structure 100 of FIG. 1, the difference between the printed circuit board structure 101 of FIG. 2 and the printed circuit board structure 100 of FIG. 1 is discussed below. In the printed circuit board structure 101, only the first epoxy resin plate body 210 of the first circuit layer plate 200 has filler particles 330 therein, that is, the second epoxy resin plate bodies 310 of the outermost second circuit layer plates 300 do not have filler particles therein at all.

Therefore, since the second epoxy resin plate bodies 310 of the two outermost second circuit layer plates 300 is totally free with filler particles therein, the whole area of the surface of each metal soldering pad 400 can completely contact the outer surface of the second epoxy resin plate body 310 of the outermost second circuit layer plate 300 so as to retain the bonding strength of the metal soldering pad 400 bonding on the second epoxy resin plate body 310, so as to increase product life and operation performance of the printed circuit board structure.

Figure 3:
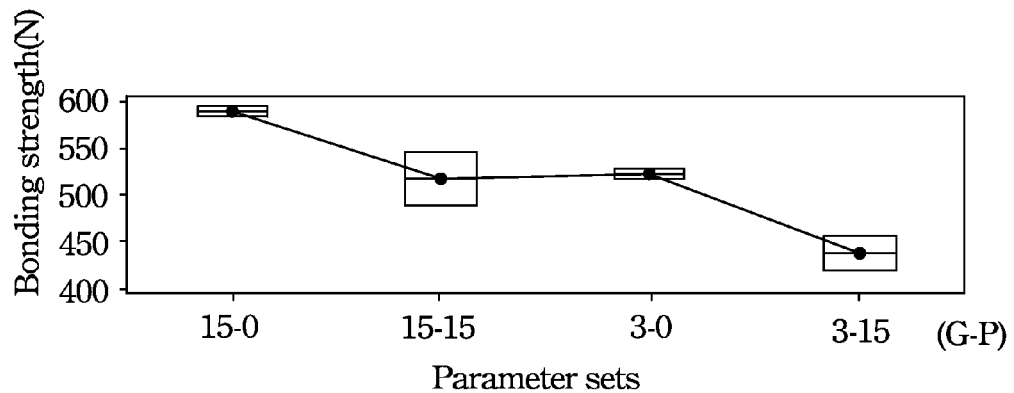
FIG. 3 is a comparison chart for the bonding strength of the soldering pad bonding on the epoxy resin plate body having 15% weight percentage of the filler particles and the bonding strength of the soldering pad bonding on the epoxy resin plate body having none of filler particles, according to the embodiment of the printed circuit board structure of the present disclosure.

FIG. 3 is a comparison chart for the bonding strength of the soldering pad bonding on the epoxy resin plate body having 15% weight percentage of the filler particles and the bonding strength of the soldering pad bonding on the epoxy resin plate body having none of filler particles, according to the embodiment of the printed circuit board structure 101 of the present disclosure.

In FIG. 3, the vertical axis of the comparison chart refers to the bonding strength (Newton, N) of the metal soldering pad bonding on the epoxy resin plate body, and the horizontal axis of the comparison chart refers to four different parameter sets, and each of the parameter sets has two parameters (G-P) in which "G" refers to the minimum distance (um) existed between the surface of the fiber fabric and the outer surface of the epoxy resin plate body, and "P" refers to the weight percentage (%) of the filler particles added in the epoxy resin plate body.

For example, as refer to FIG. 3, the leftmost one of the four parameter sets is "15-0" in which the number "15" refers to the thickness of the epoxy resin covering on the fiber fabric, that is, the minimum distance G from the outer surface of the second fiber fabric to the outer surface of the second epoxy resin plate body, and the number "0" refers to the weight percentage of the filler particles added in the second epoxy resin plate body, which means there is no filler particle added in the second epoxy resin plate body of the second circuit layer plate.

Also, refer to FIG. 3, the leftmost two of the parameter sets are "15-0" and "15-15", and both have the same parameter "G" with 15 um, however, the bonding strength (approximate to 520 N) of the metal soldering pad bonding on the second epoxy resin plate body having 15% filler particles (P=15) is obviously inferior than the bonding strength (approximate to 590 N) of the metal soldering pad bonding on the second epoxy resin plate body having none of the filler particles (P=0).

Therefore, refer to FIG. 2, the second epoxy resin plate body of the opposite and outermost circuit layer plate of the printed circuit board structure 101 of the present disclosure is preferably with none of the filler particles (P=0); and secondly, refer to FIG. 1, the second epoxy resin plate body of the opposite and outermost circuit layer plate of the printed circuit board structure 100 of the present disclosure is with the filler particles having weight percentage in a range of 0~15%, and the weight percentage of the filler particles is less than the weight percentage of the filler particles in the first epoxy resin plate body 210 of the middle circuit layer plate (i.e. the first circuit layer plate).

Furthermore, refer to FIG. 3 again, in the second and third parameter sets from left end of the comparison chart, although the bonding strength (approximate to 520 N) of the metal soldering pad bonding on the second epoxy resin plate body having the parameter set with G=15 and P=15 is still inferior than the bonding strength (approximate to 530 N) of the metal soldering pad bonding on the second epoxy resin plate body having the parameter set with G=3 and P=0, it tells that the bonding strength of the metal soldering pad bonding on the second epoxy resin plate body could be decreased if the filler particles are existed inside the second epoxy resin plate body.

To sum, by organizing the quantity of the filler particles in the epoxy resin plate bodies of both the middle circuit layer plate and the two opposite and outermost circuit layer plates, the printed circuit board structure of the disclosure not only provides appropriate thermal expansion coefficient and the heat resistance thereof, but also enhances the bonding strength of the epoxy resin and the soldering pad of the printed circuit board, so as to increase product life and operation performance of the printed circuit board structure.

Many modifications and other embodiments of the disclosures set forth herein will come to mind to one skilled in the art to which these disclosures pertain having the benefit of the teachings presented in the foregoing descriptions and the associated drawings. Therefore, it is to be understood that the disclosures are not to be limited to the specific examples of the embodiments disclosed and that modifications and other embodiments are intended to be included within the scope of the appended claims. Although specific terms are employed herein, they are used in a generic and descriptive sense only and not for purposes of limitation.

Although the present disclosure has been described with reference to the preferred embodiments thereof, it is apparent to those skilled in the art that a variety of modifications and changes may be made without departing from the scope of the present disclosure which is intended to be defined by the appended claims.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A printed circuit board structure comprising a plurality of circuit layer plates stacked together, and each of the circuit layer plates comprising:
   an epoxy resin plate body; and
   a fiber fabric completely encapsulated inside the epoxy resin plate body,
   wherein each of the circuit layer plates which is stacked between two of the circuit layer plates is further provided with filler particles distributed in the epoxy resin plate body of the circuit layer plate; and
   wherein, in all of the circuit layer plates, the two opposite and outermost circuit layer plates thereof are provided with metal soldering pads on outer surfaces of the epoxy resin plate bodies of the two opposite and outermost circuit layer plates, respectively, and both the two opposite and outermost circuit layer plates thereof are free of the filler particles in the epoxy resin plate body thereof.

2. The printed circuit board structure according to claim 1, wherein, in all of the stacked circuit layer plates, conductive patterns are respectively sandwiched between every two neighboring circuit layer plates, and electrically connected with the metal soldering pads on the two opposite and outermost circuit layer plates thereof.

3. A printed circuit board structure comprising:
   two opposite and outermost circuit layer plates, each of the two opposite and outermost circuit layer plates comprising a first epoxy resin plate body, a metal soldering pad and a first fiber fabric, wherein the metal soldering pad is bonded on an outer surface of the first epoxy resin plate body, and the first fiber fabric is completely encapsulated inside the first epoxy resin plate body; and
   a middle layer comprising at least one circuit layer plate stacked between the two opposite and outermost circuit layer plates, and each of the at least one circuit layer plate comprising a second epoxy resin plate body, a second fiber fabric completely encapsulated inside the second epoxy resin plate body, and filler particles distributed in the second epoxy resin plate body,
   wherein among the two opposite and outermost circuit layer plates and the at least one circuit layer plate of the middle layer, only the second epoxy resin plate body of the at least one circuit layer plate of the middle layer has the filler particles therein.

4. The printed circuit board structure according to claim 3, wherein the material of the filler particles comprises $SiO_2$, $Al(OH)_3$ or rubber.

5. The printed circuit board structure according to claim 3, wherein a thickness of the middle layer is not less than a thickness of each of the two opposite and outermost circuit layer plates.

6. The printed circuit board structure according to claim 3, wherein one surface of each of the metal soldering pads is completely contacted the outer surface of the first epoxy resin plate body.

7. A printed circuit board structure comprising:
   two opposite and outermost circuit layer plates, each of the two opposite and outermost circuit layer plates comprising:
      a first epoxy resin plate body;
      a metal soldering pad bonded on an outer surface of the first epoxy resin plate body;
      a first fiber fabric completely encapsulated inside the first epoxy resin plate body; and
      a plurality of first filler particles distributed in the first epoxy resin plate body with a first weight percentage, wherein the first weight percentage is greater than zero; and
   at least one middle circuit layer plate stacked between the two opposite and outermost circuit layer plates, and comprising:
      a second epoxy resin plate body;
      a second fiber fabric completely encapsulated inside the second epoxy resin plate body; and
      a plurality of second filler particles distributed in the second epoxy resin plate body with a second weight percentage, wherein the second weight percentage is greater than the first weight percentage.

8. The printed circuit board structure according to claim 7, wherein the materials of the first and second filler particles respectively comprise $SiO_2$, $Al(OH)_3$ or rubber.

9. The printed circuit board structure according to claim 7, wherein a thickness of the middle circuit layer plate is not less than a thickness of each of the two opposite and outermost circuit layer plates.

10. The printed circuit board structure according to claim 7, wherein the first weight percentage is between 0 to 15%.

* * * * *